United States Patent
Balian et al.

(10) Patent No.: US 7,147,367 B2
(45) Date of Patent: Dec. 12, 2006

(54) THERMAL INTERFACE MATERIAL WITH LOW MELTING ALLOY

(75) Inventors: Charles Balian, Guilford, CT (US); Steven E. Bergerson, Milford, CT (US); Gregg C. Currier, Norfolk, CT (US)

(73) Assignee: Saint-Gobain Performance Plastics Corporation, Wayne, NJ (US)

( * ) Notice: Subject to any disclaimer, the term of this patent is extended or adjusted under 35 U.S.C. 154(b) by 0 days.

(21) Appl. No.: 10/166,667

(22) Filed: Jun. 11, 2002

(65) Prior Publication Data

US 2003/0227959 A1 Dec. 11, 2003

(51) Int. Cl.
*G01N 25/04* (2006.01)
*G01K 1/12* (2006.01)

(52) U.S. Cl. .................. 374/44; 374/152; 361/679; 428/355 R

(58) Field of Classification Search ............... 374/160, 374/159, 165, 43; 524/404, 277; 428/261, 428/348, 349, 354, 355 R, 402, 403, 407, 428/920; 165/185
See application file for complete search history.

(56) References Cited

U.S. PATENT DOCUMENTS

| | | | |
|---|---|---|---|
| 4,092,697 A | | 5/1978 | Spaight |
| 4,147,669 A | | 4/1979 | Shaheen et al. |
| 4,299,715 A | | 11/1981 | Whitfield et al. |
| 4,427,446 A | * | 1/1984 | Miura et al. |
| 4,487,856 A | | 12/1984 | Anderson et al. |
| 4,551,490 A | * | 11/1985 | Doyle et al. |
| 4,588,762 A | * | 5/1986 | Mruk et al. .................. 524/45 |
| 4,607,277 A | * | 8/1986 | Hassan et al. |
| 4,685,987 A | | 8/1987 | Fick |
| 4,689,250 A | | 8/1987 | Quella et al. |
| 4,729,060 A | | 3/1988 | Yamamoto et al. |
| 4,744,850 A | | 5/1988 | Imano et al. |
| 4,869,954 A | | 9/1989 | Squitieri |
| 4,879,632 A | | 11/1989 | Yamamoto et al. |
| 4,888,247 A | | 12/1989 | Zweben et al. |
| 4,915,167 A | * | 4/1990 | Altoz .................. 165/185 |
| 5,062,896 A | | 11/1991 | Huang et al. |
| 5,170,930 A | * | 12/1992 | Dolbear et al. |
| 5,194,480 A | | 3/1993 | Block et al. |
| 5,290,624 A | | 3/1994 | Bujard |
| 5,302,344 A | | 4/1994 | Perlman |
| 5,325,265 A | * | 6/1994 | Turlik et al. |

(Continued)

FOREIGN PATENT DOCUMENTS

EP 0 813 244 12/1997

(Continued)

*Primary Examiner*—Gail Verbitsky
(74) *Attorney, Agent, or Firm*—Larson Newman Abel Polansky & White, LLP; Chi Suk Kim

(57) ABSTRACT

A thermal interface composition undergoes a viscoelastic change at microprocessor operating temperatures to transfer heat generated by a heat source, such as a microprocessor to a heat sink. The composition includes a low melting alloy dispersed in a matrix. The matrix comprises a viscoelastic composition which softens at about the operating temperature of the heat source. The viscoelastic composition may include a thermoplastic elastomer, a compatible hydrocarbon oil, and a tackifying resin. In use, the thermal interface composition flows under pressure between the heat source and the heat sink to make thermal contact between the two. When the heat source is operated and reaches operating temperature, the viscoelastic composition softens and the low melting alloy melts at around the operating temperature to form a highly thermally conductive, generally homogeneous mixture which readily transfers heat to the heat sink.

24 Claims, 1 Drawing Sheet

U.S. PATENT DOCUMENTS

| | | | |
|---|---|---|---|
| 5,328,087 A * | 7/1994 | Nelson et al. | |
| 5,445,308 A | 8/1995 | Nelson et al. | |
| 5,454,473 A | 10/1995 | Hennessey | |
| 5,459,352 A | 10/1995 | Layton et al. | |
| 5,510,174 A | 4/1996 | Litman | |
| 5,548,027 A * | 8/1996 | Heucher et al. | |
| 5,569,559 A * | 10/1996 | Fauvarque | 429/305 |
| 5,591,034 A | 1/1997 | Ameen et al. | |
| 5,612,153 A * | 3/1997 | Moulton et al. | 429/304 |
| 5,679,457 A * | 10/1997 | Bergerson | 428/344 |
| 5,770,318 A | 6/1998 | Friedman | |
| 5,783,862 A | 7/1998 | Deeney | |
| 5,869,412 A * | 2/1999 | Yenni et al. | 442/376 |
| 5,904,796 A | 5/1999 | Freuler et al. | |
| 5,950,066 A | 9/1999 | Hanson et al. | |
| 5,965,829 A * | 10/1999 | Haynes et al. | 75/238 |
| 6,021,844 A | 2/2000 | Batchelder | |
| 6,048,919 A | 4/2000 | McCullough | |
| 6,054,198 A | 4/2000 | Bunyan et al. | |
| 6,096,414 A | 8/2000 | Young | |
| 6,162,858 A * | 12/2000 | Auguste et al. | |
| 6,175,495 B1 * | 1/2001 | Batchelder | 361/695 |
| 6,197,859 B1 | 3/2001 | Green et al. | |
| 6,202,298 B1 | 3/2001 | Smith | |
| 6,238,596 B1 | 5/2001 | Nguyen et al. | |
| 6,281,573 B1 | 8/2001 | Atwood et al. | |
| 6,287,894 B1 * | 9/2001 | Sawin | 438/113 |
| 6,291,568 B1 | 9/2001 | Lussey | |
| 6,339,120 B1 * | 1/2002 | Misra et al. | |
| 6,391,442 B1 * | 5/2002 | Duvall et al. | 428/348 |
| 6,437,038 B1 * | 8/2002 | Chen | |
| 6,458,886 B1 * | 10/2002 | Nielsen et al. | 524/526 |
| 6,491,426 B1 * | 12/2002 | Schonath et al. | 374/45 |
| 6,562,452 B1 * | 5/2003 | Ferri | |
| 6,597,575 B1 * | 7/2003 | Matayabas et al. | 361/705 |
| 6,620,515 B1 * | 9/2003 | Feng et al. | 428/447 |
| 6,624,224 B1 * | 9/2003 | Misra | 524/404 |
| 6,630,531 B1 * | 10/2003 | Khandpur et al. | 524/505 |
| 6,649,012 B1 * | 11/2003 | Masayuki et al. | 156/272.4 |
| 6,651,732 B1 * | 11/2003 | Sagal | 165/80.3 |
| 6,663,964 B1 * | 12/2003 | Mita et al. | 428/408 |
| 6,665,186 B1 * | 12/2003 | Calmidi et al. | 361/704 |
| 6,791,839 B1 * | 9/2004 | Bhagwagar | 361/705 |
| 6,797,758 B1 * | 9/2004 | Misra et al. | 524/404 |
| 6,849,953 B1 * | 2/2005 | Smith | 257/778 |
| 2001/0038093 A1 | 11/2001 | Nguyen | |
| 2002/0007014 A1 * | 1/2002 | Hyde et al. | |
| 2002/0027910 A1 * | 3/2002 | Misra et al. | |
| 2002/0132925 A1 * | 9/2002 | Cernohous et al. | |
| 2002/0193724 A1 * | 12/2002 | Stebbings et al. | |
| 2003/0027910 A1 * | 2/2003 | Misra et al. | 524/404 |
| 2003/0049154 A1 * | 3/2003 | Xu et al. | 420/417 |
| 2003/0075312 A1 * | 4/2003 | Panck | |
| 2003/0203188 A1 * | 10/2003 | Bunyan | 428/328 |
| 2003/0234074 A1 * | 12/2003 | Bhagwagar | 156/325 |
| 2005/0073816 A1 * | 4/2005 | Hill et al. | 361/708 |

FOREIGN PATENT DOCUMENTS

| | | |
|---|---|---|
| EP | 1 067 164 | 1/2001 |
| EP | 1143511 A2 * | 3/2001 |
| EP | 1 291 913 A2 | 3/2003 |
| WO | WO 97/41599 | 11/1997 |
| WO | WO 99/19909 | 4/1999 |

* cited by examiner

THERMAL INTERFACE MATERIAL WITH LOW MELTING ALLOY

FIELD OF THE INVENTION

The present invention relates to thermally conductive materials, and more particularly, to a thermally conductive interface material comprising a low melting point alloy (LMA) that facilitates heat transfer from the heat generating device to a heat sink. The interface material finds particular application in heat generating devices, such as microprocessor power supply assemblies, and the like, although it will be appreciated that the material has a variety of other applications.

BACKGROUND OF THE INVENTION

With increasing market pressure for smaller, faster and more sophisticated end products using integrated circuits, the electronics industry has responded by developing integrated circuits which occupy less volume, yet operate at high current densities. Power supply assemblies for such microprocessors generate considerable heat during operation. If the heat is not adequately removed, the increased temperatures generated by the power supply assemblies will result in damage to the semiconductor components.

A heat sink is commonly used to transfer the heat away from the power supply or other heat generating assembly. The heat sink generally includes a plate or body formed from a conductive metal, which is maintained in thermal contact with the assembly for dissipating heat in an efficient manner. Fins optionally protrude from the plate for providing an increased surface area for heat dissipation to the surrounding environment.

The current industry technique for providing thermal contact between a microprocessor power supply assembly and a heat sink is to interpose a thermal interface material between the two, which facilitates heat transfer from the active device to the heat sink.

One method is to apply a ceramic filled thermal grease, which is typically silicone based, between the heat sink and the power supply. Thermal greases provide excellent thermal properties, but require an extensive assembly process with high manufacturing cost. The product is usually applied by hand, from a syringe, or with an aluminum carrier. This process is labor intensive and slow and does not lend itself to automation.

Another method for providing a conductive interface includes the use of thermally conductive wax compounds. These compounds, however, are generally brittle at ambient temperatures and easily chipped off, resulting in a high thermal resistance. The low viscosity of the wax at operating temperature causes the wax to flow out from between the active component and the heat sink, resulting in a high thermal resistance. Further, because of the brittle nature of the wax compounds, they are difficult to manufacture and apply to a heat sink.

Thermally conductive silicone rubbers have also been used as conductive interfaces. Although soft and pliable, the silicone rubber requires relatively high pressure and a long warm-up time to attain a low thermal resistance. The rubbers have poor flow characteristics which result in a low thermal conduction when there is a mismatch of flatness between the heat sink and the heat producing device. Differences in the thermal coefficient of expansion between the silicone rubber and the heat sink can result in high thermal resistance during temperature cycling. These effects lead to a poor thermal conductivity from the heat producing device to the heat sink.

Thermal interface materials often combine a thermally conductive filler material with a matrix of wax, grease, or polymeric material. U.S. Pat. No. 4,869,954 to Squitieri, for example, discloses a cured, form stable material for use in removing or transferring thermal energy. A urethane binder is filled with a thermally conductive material, such as boron nitride or magnesium oxide. The filled binder is used by itself or in conjunction with a reinforcing substrate for dissipating heat from an electronic component or device.

U.S. Pat. No. 5,194,480 to Block et al. relates to thermally conductive electrically insulating filled elastomer compositions including a thermoplastic rubber, which may be crosslinked and fillers such as boron nitride and alumina. The filled elastomer can be molded or pressed into desired shapes.

U.S. Pat. Nos. 5,454,473 and 5,591,034 to Ameen et al. disclose a thermally conductive interface material for thermal conduction between electronic components comprising an open structure fluoropolymer material, such as expanded polytetrafluorethylene, with uncoated thermally conductive particles attached to solid portions of the polymer.

U.S. Pat. No. 6,054,198 to Bunyan et al. discloses heat transfer materials applied to a film or release sheet. The thermally conductive materials comprise waxes, thermoplastics, or acrylic pressure sensitive adhesives, in combination with a filler, such as boron nitride.

Such materials provide a relatively high thermal conductivity by means of thermally conductive particles dispersed within a polymer matrix. However, none of these materials is able to attain the theoretical limit of conductivity that the fillers possess, primarily because of the high interfacial thermal resistance between the particles and the polymer matrix in the heterogeneous mixture.

Heat transfer members have also been formed from soft metals, such as indium or gallium alloys. See, for example, Yamamoto, et al., U.S. Pat. No. 4,729,060; Altoz, U.S. Pat. No. 4,915,167. Other thermal interfaces employ polymeric thermally conductive cure-in-place compounds. These compounds are rigid after cure. For example, Huang, et al., U.S. Pat. No. 5,062,896 discloses electroconductive solder compositions formed from powdered eutectic metal alloys, such as bismuth/tin alloys, in a polymer, such as a thermoplastic poly(imide) siloxane, which are subsequently cured. Thermoset epoxy compounds filled with silver are also disclosed. Such compositions have a poor reliability because of a difference in thermal coefficient of expansion between the material and the heat sink, causing cracks and failure during temperature cycling. The polymeric materials are labor intensive to apply and require long cure times.

U.S. Published App. 20010038093 discloses compliant crosslinkable materials, such as silicone resins, in which a solder material, such as an indium tin complex, is dispersed.

The present invention provides for a new and improved thermal interface material, which overcomes the above-referenced problems and others.

SUMMARY OF THE INVENTION

In accordance with one aspect of the present invention, a thermal interface composition for transferring heat between a heat source and a heat sink is provided. The composition includes a matrix material which softens at about the operating temperature of the heat source and a low melting alloy dispersed in the matrix material which melts at or below the operating temperature of the heat source.

In accordance with another aspect of the present invention, a method for forming a thermal interface is provided. The method includes combining a matrix material with a low melting alloy to form a thermal interface material of low melting alloy dispersed within the matrix material. The thermal interface material is positioned between a heat source and a heat sink. The low melting alloy melts at around the operating temperature of the heat source. The matrix material softens and remains soft at around the operating temperature of the heat source. The heat source is operated, whereby the low melting alloy melts and combines with the matrix material to form the thermal interface.

In accordance with another aspect of the present invention, a method of forming a thermal interface material for transferring heat from a microprocessor device to a heat sink is provided. The method includes mixing a low melting alloy with a matrix material to disperse the low melting alloy throughout the matrix material. The low melting alloy is one which melts at a temperature of above 30°C. and melts at around the operating temperature of the microprocessor device. The matrix material includes a thermoplastic elastomer which softens at around the operating temperature of the microprocessor device to form a generally homogeneous dispersion with the molten low melting alloy.

In accordance with another aspect of the present invention, a thermal interface composition which undergoes a viscoelastic change at microprocessor operating temperatures to transfer heat generated by a heat source to a heat sink is provided. The composition includes a viscoelastic composition which softens and remains soft at about the operating temperature of the heat source. The viscoelastic composition includes a thermoplastic elastomer, a compatible hydrocarbon oil, and a tackifying resin. A thermally conductive material is dispersed within the viscoelastic composition. One advantage of at least one embodiment of the present invention is the provision of a thermal interface material which has a homogeneous character during operation, thereby reducing the tendency for development of interfacial thermal resistance between the thermally conductive components and the polymer matrix in the mixture.

Another advantage of at least one embodiment of the present invention is that the thermal interface material can be pre-attached to a heat sink prior to shipment.

Another advantage of at least one embodiment of the present invention is that the cohesive strength and integrity of the thermal interface material provide for easy handling.

Still another advantage of at least one embodiment of the present invention is that the thermal performance of the thermal interface material matches or exceeds that of thermal grease in a solid film form.

Still another advantage of at least one embodiment of the present invention is that the assembly process associated with thermal grease is eliminated but an equivalent thermal performance is maintained.

Still another advantage of at least one embodiment of the present invention is that the material softens and conforms to surface roughness or concavity at operating temperature.

Still another advantage of at least one embodiment of the present invention is that the material can be applied and repositioned with thumb pressure allowing for easy field service.

Still another advantage of at least one embodiment of the present invention is that the material allows for vertical mounting due to its cohesive properties.

Still other benefits and advantages of the invention will become apparent to those skilled in the art upon a reading and understanding of the following detailed specification.

BRIEF DESCRIPTION OF THE FIGURE

The invention may take form in various components and arrangements of components, and in various steps and arrangements of steps. The drawing is only for purposes of illustrating a preferred embodiment and is not to be construed as limiting the invention.

DETAILED DESCRIPTION OF THE INVENTION

Figure 1:
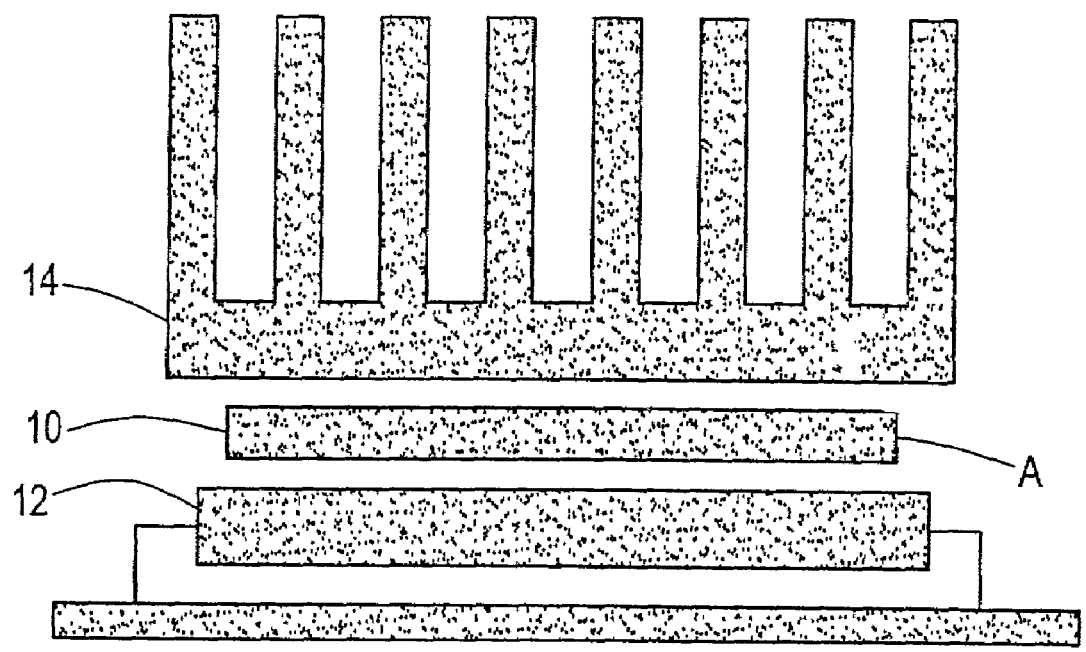
FIG. 1 is a schematic view of a heat sink, heat source, and intermediate thermally conducting film, according to the present invention.

With reference to FIG. 1, a thermally conductive, interface material A in the form of a film or layer 10 provides a thermal interface between an active device or heat source 12 and an adjacent heat sink 14. The heat source may be a microprocessor power supply assembly, or component of an electronic circuit, such as a transistor, diode, relay, resistor, amplifier, or capacitor, or other heat-generating electronic component. It will be appreciated, however, that the heat source or device 12 can be any type of semiconductor device or power supply assembly that generates excess heat in its operation, which heat if not removed, may damage the device or impair operation of the device. The heat source typically will have an operating temperature of from about 60–100°C. The heat sink may be a block of heat transmissive material, to facilitate heat transfer from the device 12 to the heat sink 14. The heat sink is constructive of a metal material or the like and is effective for dissipating thermal energy therefrom by conduction or radiation.

The layer 10 is preferably of from about 0.0025 to 2.5 millimeters in thickness. The film thickness can be further increased, if desired, to accommodate certain application requirements, such as larger spacing characteristics in electronics or power supply cooling application.

The thermal interface material A includes a composition which includes a matrix material and a low melting alloy (LMA). By "low melting alloy" or LMA it is meant an alloy of two or more metals which has a melting point at or below the operating temperature of the heat source. The low melting alloy is preferably one which is a solid at ambient temperature (15–30°C.) and melts at a temperature of above about 30°C., more preferably, above about 40°C.

The matrix material and low melting alloy are preferably selected and combined such that they form an emulsion which coalesces into a continuous film prior to, or during melting of the matrix material, such that at microprocessor operating temperatures the material A acts to transfer heat generated by a heat source to a heat sink. During use, the heat generated by the microprocessor warms the layer 10. The material A undergoes a softening or phase change at or just below the operating temperature of the microprocessor. This results in the elimination of thermally insulating air pockets and increases the thermal conductivity of the already relatively thermally conductive material. The material A transfers the heat generated by the microprocessor 12 to the heat sink 14. For example, electronic devices with which the thermal interface material is to be used may have an operating temperature of about 60–80° C. In this case, the LMA and the matrix preferably has a melting point of 35–80° C., more preferably, 45–60° C.

The matrix material acts as a binder to hold the composition together and also prevents excessive flow out. The matrix material is one that remains uncured at the operating temperature of the heat source, i.e., it remains soft and pliable during operation. Preferably, it is soft at room temperature or softens at the operating temperature of the heat source. More preferably, the matrix material undergoes a phase change at or sightly below the device operating range. By "phase change" it is meant that the matrix material softens from a solid or semi-solid material to a viscous, grease-like, flowable, or liquid material which, together with the LMA, is capable of conforming to the uneven surface of the heat source and/or heat sink to which it is attached. As a result, the thermal resistance is much lower than for compositions which do not exhibit such a phase change.

The matrix material preferably comprises a polymer composition, such as a viscoelastic composition, which has adhesive qualities at room temperature and which softens to a grease-like consistency at about the operating temperature of the heat source and at or slightly above the melting point of an LMA dispersed within the viscoelastic composition.

The LMA has a melting point which is at or below the operating temperature of the heat source. Suitable LMAs include alloys of two or more elements of the following: bismuth, indium, tin, lead, and antimony. Trace amounts of cadmium can be incorporated into the LMA to lower the melting point of the alloy. The alloy preferably has a thermal conductivity of 1–100 watt/meter.K, more preferably, 5–20 w/m.K. A preferred low melting alloy is a mixture of bismuth, indium and tin in a ratio of 10–50% bismuth, 2–30% tin, and 30–80% indium, more preferably, 20–40% bismuth, 10–20% tin, and 50–70% indium. An exemplary alloy is 32.5% bismuth, 16.5% tin, and 61% indium, which melts at a temperature of about 60°C. Another exemplary alloy is 48% Bi, 25.6% lead, 12.8% tin, 9.6% cadmium, and 4.0% indium, which has a melting point of about 61–65°C.

The specific LMA selected will depend on the anticipated operating temperature of the heat source with which it is intended to be used. By varying the composition of the alloy, a wide range of different melting point ranges can be obtained. Choosing one that melts or is molten at the operating temperature of a microprocessor is thus relatively simple. The resulting viscosity is sufficient for the material A to flow and wet the adjacent surfaces of the heat sink 14 and microprocessor heat source 12, creating thermal conduction paths and excellent thermal contact. Surface discontinuities in the heat sink and microprocessor heat source are filled with the material A. However, the viscosity is not so low that the material A flows out from between the parts 12, 14. To ensure that the thermal interface material has a relatively broad melting point, yet does not flow too readily at room temperatures, a combination of alloys having differing melting points may be employed.

The thermal interface material is preferably formed as a thin film, for example, by molding, casting, extruding, or the like. The film preferably has a thickness of from about 0.0025 to 2.5 mm, more preferably, 0.01–1 mm, most preferably, from about 0.04–0.15 mm. When molded or cast into a such a thin film and placed between a heat source and heat sink, excellent thermal conductivity is attained as soon as operating temperature is attained and the LMA melts and makes intimate contact with the mating surfaces. The good thermal performance may be due, in part, to the fact that the intrinsic thermal conductivity of most LMAs is far better than that of generally used ceramic and particulate materials, such as BN, AlN, SiC, and the like. Additionally, since the LMA melts, it is able to form a homogeneous, or near homogeneous mixture with the matrix material. As a consequence, interfacial thermal resistance between the thermally conductive material (in this case, the LMA) and the matrix is drastically reduced, as compared with an equivalent matrix filled with a conventional thermally conductive material, such as BN, AlN, or SiC. For example, thermal conductivities of the thermal interface material of 1–20 W/m.K, more frequently, 2–10 W/m.K, are readily attained.

For particularly effective thermal interface materials, it is desirable to ensure intimate contact with the mating surfaces (heat sink and heat source). It is preferred that contact and some degree of thermal conduction be attained before the LMA melts. The matrix material thus preferably includes an adhesive material capable of being adhered to the heat source and or heat sink prior to operation of the device. It has been found that by making an emulsion of the LMA in a viscoelastic composition the composition can be adhered to the mating surfaces of a heat source and/or a heat sink. The emulsion takes the form of small, preferably spherical particles of the LMA dispersed throughout the matrix material. When the composition melts at or around the operating temperature of the heat source, the emulsion breaks and a continuous film forms. The continuous film formed is ideally a homogeneous or generally homogeneous mixture of the matrix material and the LMA in which the LMA is intimately mixed with the matrix material and few, if any, discrete particles of LMA are present.

Suitable polymers for forming the matrix include single or multi-component elastomers, consisting of one or more of the following: silicone, acrylic, natural rubber, synthetic rubber, or other appropriate elastomeric materials. Exemplary viscoelastic materials include adhesives, such as hot melt adhesives and/or pressure sensitive adhesives, such as alkenylarene copolymers, urethanes, rubbers, acrylics, silicones, polyesters, and vinyls.

Preferred hot-melt adhesives include A-B-A block copolymers in which the A block is typically an alkenyl arene polymer derived from a monomer such as styrene. The B block is typically a polymer of a conjugated aliphatic diene monomer of 4 to 6 carbon atoms or a linear alkene monomer of 2 to 6 carbon atoms. Suitable dienes include butadiene, isoprene, and the like. Suitable alkenes include ethylene, propylene, butylene and the like. The B block may be a combination of one or more alkenes and/or dienes.

Other suitable pressure sensitive adhesives include acrylics, for example, acrylate and methacrylate copolymers such as copolymers of methyl methacrylate and ethyl acrylate. Rubbers, including, for example, terpolymer elastomers made from ethylenepropylene-diene monomer (EPDM) as well as styrene-butadiene rubbers (SBR), and polymers (including copolymers) of 1,4-butadiene and isoprene, may also be used.

Preferably, the matrix material is a viscoelastic composition which softens into a grease or grease-like material at about the operating temperature of the heat source but above the melting point of the chosen LMA.

An exemplary viscoelastic material includes
(1) A thermoplastic elastomer, and may include one or more of the following:
    (2) a compatible plasticizer;
    (3) a tackifying resin;
    (4) a dispersing agent;
    (5) an antioxidant or other preservative colorants, and other additives.

More preferably, the viscoelastic material includes from about 5–15%, more preferably, about 10% of a thermoplastic elastomer, from about 40–70%, more preferably, about 60% of a compatible plasticizer, from about 20–40%, more preferably, about 30% of a tackifying resin, and may also include about 1% of a dispersing agent, and about 1% of an antioxidant.

A preferred thermoplastic elastomer (1) includes a triblock A-B-A polymer wherein the polymer blocks A comprise thermoplastic polymer blocks of an alkenyl arene, such as polystyrene, or mixtures thereof, while the polymer blocks B are alkene blocks comprising a polymer of ethylene, propylene, 1-butene, 2-butene, isobutylene, butadiene, isoprene or mixtures thereof. The styrene-alkylene-styrene triblock copolymers having particular utility comprise polystyrene end blocks chemically bound to an ethylene-butylene midblock.

Representative polystyrene/polyalkylene triblock polymers are marketed under the tradename Kraton by Shell Chemicals. For example, Kraton™ 1107 is a poly (styrene-isoprene-styrene) triblock copolymer with an approximate intrinsic viscosity of 1.13 and a styrene:isoprene ratio of 14:86. Kraton™ 1650 is a poly (styrene-ethylene-butylene-styrene) triblock copolymer having a styrene:ethylene-butylene ratio of 28:72 and a Brookfield viscosity at 15% solids in cyclohexane of 360 centipoise at 25°C. Kraton™ 1651 is a poly (styrene-ethylene-butylene-styrene) triblock copolymer having a styrene:ethylene-butylene ratio of 33:67. Kraton™ 1652 is a similar poly (styrene-ethylene-butylene-styrene) triblock copolymer, having a styrene:ethylene-butylene ratio of 29:71. Other suitable copolymer systems of this type are described in J. Polymer Sci. Part C, No. 26, pp. 37–57 (1969).

Suitable compatible plasticizers (2) include mineral oils, polyalphaolefins, synthetic ester base oils, and mixtures thereof. By the term "compatible" it is meant that the hydrocarbon oil or other plasticizer is miscible, i.e., soluble, in both the thermoplastic elastomer (1) and the tackifying resin (3). The adhesive (1), e.g., styrene ethylene butylene styrene block copolymer is solubilized by the oil (2).

Exemplary mineral oils include paraffinic oils, naphthentic oils, aromatic oils, and mixtures thereof. In a preferred embodiment, the hydrocarbon oil is a mineral oil comprising a paraffinic oil and an aromatic oil, wherein the ratio of paraffinic oil:aromatic oil is from 30–70:70–30, and in a most preferred embodiment from 40–60:60–40. A representative example is Shellflex 371 (obtainable from Shell Chemicals).

The tackifying (tackifier) resin (3) is preferably a material which extends the adhesive properties and improves the specific adhesion of the thermoplastic elastomer. Suitable tackifying resins include natural rosins; modified rosins; glycerol esters of natural and modified rosins; pentaerythritol esters of natural and modified rosins; hydrogenated rosins; the pentaerythritol ester of tall oil rosin; phenolic-modified pentaerythritol esters of rosin; polyterpene resins; copolymers and terpolymers of natural terpenes; phenolic-modified terpene resins; aliphatic petroleum hydrocarbon resins resulting from the polymerization of monomers consisting primarily of olefins and diolefins; aromatic petroleum hydrocarbons and the hydrogenated derivatives thereof; and aliphatic/aromatic petroleum derived hydrocarbons and the hydrogenated derivatives thereof.

A mixture of two or more of the above-described tackifying resins is also contemplated within the scope of this invention. Other suitable tackifying resins are discussed in Handbook of Pressure Sensitive Adhesive Technology, $2^{nd}$ edition, 1989, edited by Donatas Satas, pages 527 to 544. An exemplary tackifying resin is Regalite V 1110™ (obtained from Hercules), which includes an aliphatic aromatic polymer.

The dispersing agent helps to disperse thermally conductive materials in the composition. A suitable dispersing agent is KR TTS, available from Kenrich Petrochemicals, Inc., of Bayonne, N.J. The antioxidant acts as a preservative. An exemplary antioxidant is Erganox™ 1010, available from Shell. Other suitable dispersing agents and antioxidants are known to those skilled in the art.

In the preferred embodiment of the present invention, a hot melt thermoplastic adhesive is formulated generally with the above constituents (1), (2), and (3), and optionally, (4), (5), and (6). The adhesive is formulated so that it is a firm pressure sensitive adhesive at room temperature and a high viscosity grease at the working temperature of the microprocessor heat source. The LMA preferably melts below the phase change temperature of the thermoplastic adhesive.

A suitable polymer matrix has been found to be a mixture of a polymer, such as Kraton™, e.g., Kraton™ 1652 (an uncured tri-block polymer of ethylene-propylene styrene); a tackifying resin, such as Regalite V 1100™, an oil (plasticizer), such as Shelflex™ 371, and an antioxidant such as Erganox™ 1010, available from Shell. These are preferably mixed in the following proportions: one part Kraton 1652, two parts Regalite, three parts Shelflex, and 0.05 parts antioxidant.

The thermal interface material may also include a thermally-conductive filler, which, unlike the LMA, remains solid at the operating temperature of the device. The thermally conductive filler is preferably selected from a variety of materials having a bulk thermal conductivity of between about 0.5 and 1000.0 Watts/meter-K as measured according to ASTM D1530. Examples of suitable thermally conductive fillers include, but are not limited to, boron nitride, aluminum oxide (alumina), aluminum nitride, magnesium oxide, zinc oxide, beryllium oxide, silicon carbide, nickel powder, copper flakes, graphite powder, powdered diamond, and mixtures thereof. For example, the thermally conductive filler may be incorporated into the viscoeleastic material in a ratio of about 1 part viscoelastic material to 1.5 parts thermally conductive filler.

For some applications, it is preferable for the thermally conductive filler to be electrically non-conductive, such that the thermal interface layer may provide an electrically insulating but thermally conductive barrier between the heat source and heat sink.

Preferably, the particle size of the filler, the particle size distribution, and filler loading (concentration in the film) are selected to maximize packing and thus produce the most efficient thermal conductance. Preferably, the particle size of the thermally conductive filler is between about 2 and 100 microns.

To form the composition A, the matrix material is mixed with the LMA and filler particles, where present. In one preferred method of forming the composition A, the matrix material (e.g., thermoplastic adhesive together with antioxidant and dispersing agent) is heated to melting temperature. When the adhesive is fluid and smooth, the LMA is added and is melted. The mixture is stirred. Stirring vigorously incorporates the LMA as a fine dispersion. Surface tension forces, however, cause the LMA to disperse as small droplets. The droplets become smaller as mixing continues until a fine emulsion is achieved. The mixture is then allowed to cool. Cooling the mixture while continuing to stir solidifies the LMA into discreet tiny particles, suspended in the matrix. The particles are visible as spherical balls under high-powered magnification. Cooling further produces an adhesive mass wherein the LMA is dispersed as fine particles of about 5–50 microns average diameter, more preferably, 10–25 microns average diameter.

Preferably, the ratio of matrix material to LMA is from about 1:1 to about 1:20, more preferably, between 1:5 and 1:10, most preferably, about 1:9. When the weight of LMA in the mixture is too high, the LMA tends to solidify in the composition as large or agglomerated particles, which do not disperse so readily when the composition melts. By keeping the LMA at around 50% by volume of the composition (roughly 1:9 wt/wt), or less, the LMA tends to cool as small, discrete particles, which are well dispersed throughout the matrix.

When a thermally conductive filler, such as zinc oxide, boron nitride, or alumina, is to be incorporated into the composition, an alternative method for preparing the composition A includes coating particles of the thermally conductive filler with the low melting alloy and incorporating the coated particles into the matrix material. In this method, the LMA is melted and the particles of thermally conductive filler are added to the molten LMA and stirred to coat the particles. Preferably, the particles are in the form of discrete particles when cooled. However, if agglomeration occurs, the agglomerated mixture can be ground to produce particles of approximately the same dimensions as the original filler particles. The coated particles are incorporated into molten matrix material and the mixture stirred.

To improve the spreading characteristics of the material A, a processing aid, such as a solvent, may be added to the mixture. For example, the adhesive mass of matrix material and dispersed LMA particles is dissolved in a suitable solvent wherein the LMA is still in discreet tiny particles visible as spherical balls under high-powered magnification.

Suitable solvents include low boiling aromatic and aliphatic compounds, such as toluene, benzene, xylene, heptane, mineral spirits, ketones, esters, alcohols, such as isopropyl alcohol, and mixtures thereof. A particularly preferred solvent is toluene, or a mixture of toluene and isopropyl alcohol. The isopropyl alcohol assists in dissolving the matrix material component in the mixture. For example, a mixture of solvent, LMA, filler particles, and matrix material may comprise 60% solvent.

The solution of the LMA dispersion can be coated on a heat sink or heat source or applied to a release liner in a conventional manner to a desired dry thickness. The solvent generally evaporates, leaving the composition A ready for use. The adhesive nature of the composition allows it to be readily adhered to a heat sink and attached to the microprocessor. This can be achieved using light pressure and/or heat.

The release liner may be a conventional silicone coated paper having a moisture content from about 2 to about 6 percent by weight and coated on one or both sides with a silicone release coating or other release coating. A release liner may be applied to one or both sides of the layer 10. The release paper may be a conventional release paper, e.g., a 0.05–0.15 kg/m² paper. Non-paper based release liners, e.g., polymer films, are also contemplated. For example, the protective liner comprises a coated substrate, such as SCK polyethylene-coated paper (e.g., PN 907826, 20", or 909785,24"), polyethylene or polyester film, coated with a release coating, such as a polydimethyl siloxane, fluorosilicone, or non-silicone release coating. Examples of such laminates include blue poly 2.5 mil 2S PN 9099037. The release liner protects the film of thermally conductive material against damage prior to application to the heat sink or active device. The liner is peeled off prior to use.

Optionally, the layer 10 may also include a reinforcement layer, which is provided to improve the mechanical strength of the film. The reinforcement layer may include a polymeric film, woven or non-woven cloth, such as glass cloth (formed from fiberglass), or a metallic film, such as aluminum. Alternatively, reinforcement materials, such as fibers or woven cloth, may be embedded in the thermally conductive layer 10 itself.

During use, the heat generated by the microprocessor warms the layer 10. The heat generated turns the composition to grease, melts the LMA, and breaks the dispersion forming a continuous film of LMA/matrix. This allows wet-out of the heat sink and microprocessor surfaces by the thermally conductive material A, resulting in the elimination of thermally insulating air pockets. After initial wetting, the material A proceeds to transfer the heat generated by the microprocessor 12 to the heat sink 14.

The thermal performance of the thermally conductive layer 10 matches or exceeds that of ceramic filled greases commonly used in the industry. However, the film retains a relatively high melt viscosity to eliminate excessive flow and dripping from vertically mounted assemblies. During thermal cycling (on/off switching of the heat generating device 12) the film 10 maintains interfacial contact and excellent thermal performance. The specific formulation of the film 10 is preferably selected according to the conditions to which the film is to be exposed (e.g., operating temperature, temperature cycling characteristics, and the like). This allows customized adjustment and control for viscosity, thermal conductivity, and heat melt/flow properties to allow precise performance matching to various applications or requirements.

Without intending to limit the scope of the invention, the following examples indicate the type of compositions effective as thermal interface materials.

EXAMPLES

Example 1

A thermal transfer composition was prepared by forming a matrix an incorporating an LMA into the matrix. The following components were melted together to form the matrix:

1 part by weight Kraton 1652
2 parts by weight Regalite
3 parts by weight Shellflex
0.05 parts by weight antioxidant.

The melted matrix was a clear fluid liquid which, if cooled, becomes a solid pressure sensitive adhesive. The polymer matrix was combined with an LMA in the ratio of 1 part by weight polymer matrix to 9 parts by weight LMA at a temperature above the melting point of the LMA (i.e., above 60°C.). The LMA was an alloy comprising 32.5% bismuth, 16.5% tin, and 61.0% indium, having a melting point of 60° C.

With stirring the melt became dark gray as the silvery LMA is incorporated into the polymer melt. The mixture of matrix and LMA was removed from the heat source and stirred as it cooled. When the mixture temperature is below the melt point of the LMA the dispersion is stable.

Example 2

A matrix was formed by melting together:

1 part by weight Kraton 1652
2 parts by weight Regalite 1100 resin
3 parts by weight Shellflex Oil 371
0.05 parts by weight Irganox 1010 (antioxidant)
0.05 parts by weight TTS Titanate (a wetting and flux agent)

The melted matrix was combined with the LMA of Example 1 in the ratio of 1 part matrix to 9 parts LMA at a temperature above the melting point of the LMA (i.e., above 60°C.).

The mixture of matrix and LMA was removed from the heat source and stirred as it cooled. When the mixture temperature is below the melt point of the LMA the dispersion is stable.

The cooled dispersion was converted into a thin film suitable for use as a thermal interface materials by calendaring, dissolving and coating onto a release liner. When used at a thickness of approximately 0.1 mm in a pentium emulator gave a ΔT of 5°C. ΔT is defined as Tj-Ts, where Tj is the junction temperature of the microprocessor and Ts is the temperature of the heat sink. A low ΔT thus indicates an effective thermal interface material.

Example 3

A polymer matrix was formed as for Example 2 but with the addition of 9 parts by weight of zinc oxide (ZnO).

The melted matrix and ZnO was a white liquid which, if cooled, becomes a solid pressure sensitive adhesive.

The melted matrix with ZnO was combined with the LMA of Example 1 in the ratio of 1 part of polymer matrix plus ZnO to 2 parts LMA at a temperature above the melting point of the LMA. With stirring, the melt became light gray as the silvery LMA was incorporated into the polymer melt.

The mixture was removed from the heat source and stirred as it cooled. When the mixture temperature is below the melt point of the LMA the dispersion is stable.

The cooled dispersion was converted into a thin film suitable for use as a thermal interface material by calendaring, dissolving, and coating on a release liner.

When the interface material was used a thickness of approximately 0.1 mm in a pentium emulator gave a ΔT of 4° C. The addition of ZnO gave an interface material which has higher thermal conductivity than the polymer matrix plus LMA alone.

While the invention has been explained in relation to its preferred embodiments, it is to be understood that various modifications thereof will become apparent to those skilled in the art upon reading the present description. Therefore, it is to be understood that the invention disclosed herein is intended to cover such modifications as fall within the scope of the appended claims.

What is claimed is:

1. A thermal interface composition for transferring heat between a microprocessor and a heat sink, comprising:
   a matrix material which softens at a temperature of about the operating temperature of the microprocessor; and
   a low melting alloy in the form of a dispersion in the matrix material substantially free of agglomerated particles, the low melting alloy melting below said temperature at which the matrix material softens, the low melting alloy being a solid at ambient temperature.

2. The thermal interface composition of claim 1, wherein the low melting alloy is a solid at ambient temperature.

3. A thermal interface composition for transferring heat between a microprocessor and a heat sink, comprising:
   a matrix material which softens at a temperature of about the operating temperature of the microprocessor, the matrix material including a viscoelastic material which undergoes a viscoelastic change at microprocessor operating temperatures; and
   a low melting alloy in the form of a dispersion in the matrix material substantially free of agglomerated particles, the low melting alloy melting below said temperature at which the matrix material softens.

4. A thermal interface composition for transferring heat between a heat source and a heat sink, comprising:
   a matrix material which softens at a temperature of about the operating temperature of the heat source, the matrix material including a pressure sensitive adhesive; and
   a low melting alloy in the form of a dispersion in the matrix material substantially free of agglomerated particles, the low melting alloy melting below said temperature at which the matrix material softens.

5. The thermal interface composition of claim 4, wherein the matrix material includes:
   a thermoplastic elastomer;
   a compatible plasticizer; and
   a tackifying resin.

6. The thermal interface composition of claim 5, wherein the thermoplastic elastomer includes a styrene-alkylene-styrene triblock copolymer.

7. (The thermal interface composition of claim 6, wherein the styrene-alkylene-styrene triblock copolymer includes an alkylene selected from the group consisting of ethylene, propylene, 1-butene, 2-butene, isobutylene, butadiene, isoprene, and combinations thereof.

8. The thermal interface composition of claim 7, wherein the thermoplastic elastomer is selected from the group consisting of poly (styrene-butadiene-styrene) triblock copolymers; poly (styrene-ethylene-butylene-styrene) triblock copolymers; poly (styrene-isoprene-styrene) triblock copolymers; and combinations thereof.

9. The thermal interface composition of claim 5, wherein the compatible plasticizer includes a hydrocarbon oil selected from the group consisting of mineral oils, synthetic oils, and mixtures thereof.

10. The thermal interface composition of claim 9, wherein the mineral oil is selected from the group consisting of paraffinic oils, naphthenic oils, aromatic oils, and mixtures thereof.

11. The thermal interface composition of claim 5, wherein the tackifying resin is selected from the group consisting of natural rosin, modified rosin, glycerol esters of natural and modified rosins; pentaerythirtol esters of natural and modified rosins, polyterpene resins, copolymers of natural terpenes, terpolymers of natural terpenes, phenolic-modified terpene resins, aliphatic petroleum hydrocarbon resins, aromatic petroleum hydrocarbons, hydrogenated derivatives of aromatic petroleum hydrocarbons, aliphatic petroleum derived hydrocarbons, aromatic petroleum derived hydrocarbons, hydrogenated derivatives of aliphatic petroleum derived hydrocarbons, hydrogenated derivatives of aromatic petroleum derived hydrocarbons, and mixtures thereof.

12. The thermal interface composition of claim 1, further including:
   a thermally conductive filler dispersed within the matrix material.

13. The thermal interface composition of claim 12, wherein the thermally conductive filler is selected from the group consisting of born nitride, aluminum oxide, aluminum nitride, magnesium oxide, zinc oxide, beryllium oxide, silicon carbide, nickel powder, copper flakes, graphite powder, powdered diamond, and mixtures thereof.

14. The thermal interface composition of claim 1, wherein the low melting alloy includes an element selected from the group consisting of bismuth, indium, tin, antimony, and combinations thereof.

15. The thermal interface composition of claim 14, wherein the low melting alloy includes bismuth, indium, and tin.

16. The thermal interface composition of claim 15, wherein the low melting alloy includes bismuth, indium, and tin in a ratio of 10–50% bismuth, 2–30% tin, and 30–80% indium.

17. The thermal interface composition of claim 1, wherein a weight ratio of the matrix material to the low melting alloy is from 1:1 to 1:20.

18. The thermal interface composition of claim 1, wherein a weight ratio of the matrix material to the low melting alloy is from 1:1 to 1:10.

19. A method for forming a thermal interface comprising:
  combining a matrix material with a low melting alloy to form a thermal interface material of low melting alloy dispersed within the matrix material, including:
    mixing the low melting alloy with the matrix material at a sufficient temperature such that the low melting alloy melts and is dispersed in the form of a fine dispersion throughout the matrix material, the low melting alloy being substantially free of agglomerated particles, and
    cooling the mixture of low melting alloy and matrix material such that the low melting alloy is dispersed throughout the matrix material as discrete particles;
  positioning the thermal interface material between a microprocessor and a heat sink, the matrix material being one which softens and remains soft at a softening temperature around the operating temperature of the microprocessor, the low melting alloy being one which melts below the softening temperature; and
  operating the heat source, whereby the low melting alloy melts and combines with the matrix material to form the thermal interface.

20. A method of forming a thermal interface material for transferring heat from a microprocessor device to a heat sink, comprising:
  mixing a low melting alloy with a matrix material to disperse the low melting alloy in the form of a dispersion throughout the matrix material substantially free of agglomerated particles, the low melting alloy being one which melts at a temperature of between about 30° C. and about the operating temperature of the microprocessor device, the matrix material comprising a thermoplastic elastomer and plasticizer which softens at a softening temperature around the operating temperature of the microprocessor device to form a generally homogeneous dispersion with the molten low melting alloy, wherein the low melting alloy melts below the softening temperature.

21. The method of claim 20, further including:
  the step of mixing including mixing the low melting alloy with the matrix material at a sufficient temperature such that the low melting alloy melts and is dispersed throughout the matrix material; and
  after the step of mixing, cooling the mixture of low melting alloy and matrix material while continuing to mix the mixture such that the low melting alloy is dispersed throughout the matrix material as particles.

22. The method of claim 20, further including:
  coating a filler material with the low melting alloy; and
  the step of mixing including mixing the filler material coated with the low melting alloy with the matrix material.

23. A thermal interface composition which undergoes a viscoelastic change at microprocessor operating temperatures to transfer heat generated by a heat source to a heat sink, the composition comprising:
  (A) a viscoelastic composition which softens and remains soft at a temperature of about the operating temperature of the heat source, the viscoelastic composition comprising:
    (1) a thermoplastic elastomer,
    (2) a compatible hydrocarbon oil, and
    (3) a tackifying resin; and
  (B) a thermally conductive material in the form of a dispersion within the viscoelastic composition substantially free of agglomerated particles, the thermally conductive material having a melting point below said temperature at which the viscoelastic composition softens.

24. The composition of claim 23, wherein the thermally conductive material comprises a low melting alloy (LMA) incorporated in dispersion form within the composition.

* * * * *

UNITED STATES PATENT AND TRADEMARK OFFICE
CERTIFICATE OF CORRECTION

PATENT NO.        : 7,147,367 B2
APPLICATION NO.   : 10/166667
DATED             : December 12, 2006
INVENTOR(S)       : Charles Balian et al.

It is certified that error appears in the above-identified patent and that said Letters Patent is hereby corrected as shown below:

Col. 11, line 59, please delete "claim 1" and insert therefor, --claim 3--.

Col. 12, line 22, please delete "(The thermal" and insert therefore, --The thermal--.

Col. 12, line 35, please delete "mineral oils, synthetic oils" and insert therefore, --mineral oils, polyalphaolefins, synthetic oils--.

Signed and Sealed this

Seventh Day of August, 2007

JON W. DUDAS
*Director of the United States Patent and Trademark Office*